(12) United States Patent
Friend et al.

(10) Patent No.: US 9,276,525 B2
(45) Date of Patent: Mar. 1, 2016

(54) ADAPTIVE BIASING TECHNIQUE FOR AUDIO CIRCUITRY

(71) Applicant: Conexant Systems, Inc., Irvine, CA (US)

(72) Inventors: Brian W. Friend, Carlsbad, CA (US); Lorenzo Crespi, Costa Mesa, CA (US); Kyehyung Lee, Irvine, CA (US)

(73) Assignee: CONEXANT SYSTEMS, INC., Irvine, CA (US)

( * ) Notice: Subject to any disclaimer, the term of this patent is extended or adjusted under 35 U.S.C. 154(b) by 29 days.

(21) Appl. No.: 14/197,138

(22) Filed: Mar. 4, 2014

(65) Prior Publication Data

US 2014/0247091 A1 Sep. 4, 2014

Related U.S. Application Data

(60) Provisional application No. 61/772,451, filed on Mar. 4, 2013.

(51) Int. Cl.
*H03G 3/30* (2006.01)
*H03F 1/02* (2006.01)
*H03F 3/187* (2006.01)
*H03F 3/45* (2006.01)
*H03G 1/00* (2006.01)

(52) U.S. Cl.
CPC .............. *H03F 1/0211* (2013.01); *H03F 3/187* (2013.01); *H03F 3/45192* (2013.01); *H03F 3/45475* (2013.01); *H03F 3/45179* (2013.01); *H03F 2203/45112* (2013.01); *H03F 2203/45494* (2013.01); *H03F 2203/45528* (2013.01); *H03G 1/0088* (2013.01)

(58) Field of Classification Search
CPC ..... H03F 1/0211; H03F 3/45475; H03F 3/187; H03F 3/45192
USPC ........................................ 330/9, 253, 254, 281
See application file for complete search history.

(56) References Cited

U.S. PATENT DOCUMENTS

| | | | |
|---|---|---|---|
| 6,300,837 B1 | 10/2001 | Sowlati et al. | |
| 6,791,418 B2 | 9/2004 | Luo et al. | |
| 7,723,968 B2 | 5/2010 | Okuyama et al. | |
| 7,986,186 B2 | 7/2011 | Marbell et al. | |
| 8,081,777 B2 | 12/2011 | North | |
| 8,188,794 B2 * | 5/2012 | Lautzenhiser | 330/285 |
| 8,810,317 B2 * | 8/2014 | Kadoi et al. | 330/285 |

* cited by examiner

*Primary Examiner* — Khanh V Nguyen
(74) *Attorney, Agent, or Firm* — Haynes and Boone, LLP

(57) ABSTRACT

A circuit comprising a peak detector configured to receive a positive voltage input, a negative voltage input and a reference current source input and to output a peak signal data value. A fast attack current source control coupled to the peak detector and configured to generate a current source control signal as a function of the peak signal data value. A slow decay control coupled to the fast attack current source control and configured to reduce the current source control signal based on a predetermined or user-selected decay rate. A variable current source coupled to the fast attack current source control and configured to generate a variable current as a function of the current source control signal. Amplifier circuitry coupled to the variable current source, the amplifier circuitry configured to receive the variable current.

19 Claims, 4 Drawing Sheets his application claims priority to U.S. Provisional Application No. 61/772,451, filed on Mar. 4, 2013, and which is hereby incorporated by reference for all purposes as if set forth herein in its entirety.

ADAPTIVE BIASING TECHNIQUE FOR AUDIO CIRCUITRY

RELATED APPLICATIONS

This application claims priority to U.S. Provisional Application No. 61/772,451, filed on Mar. 4, 2013, and which is hereby incorporated by reference for all purposes as if set forth herein in its entirety.

TECHNICAL FIELD

The present disclosure relates generally to audio circuitry, and more specifically to an adaptive biasing technique for audio circuitry that utilizes a peak detector with a fast attack and slow decay control of a current source.

BACKGROUND OF THE INVENTION

Low power dissipation is an important performance metric for integrated audio circuitry. It is imperative that the audio circuitry be as low power and simple as possible, while not impairing or compromising performance.

SUMMARY OF THE INVENTION

A circuit comprising a peak detector configured to receive a positive voltage input, a negative voltage input and a reference current source input and to output a peak signal data value. A fast attack current source control coupled to the peak detector and configured to generate a current source control signal as a function of the peak signal data value. A slow decay control coupled to the fast attack current source control and configured to reduce the current source control signal based on a predetermined or user-selected decay rate. A variable current source coupled to the fast attack current source control and configured to generate a variable current as a function of the current source control signal. Amplifier circuitry coupled to the variable current source, the amplifier circuitry configured to receive the variable current.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
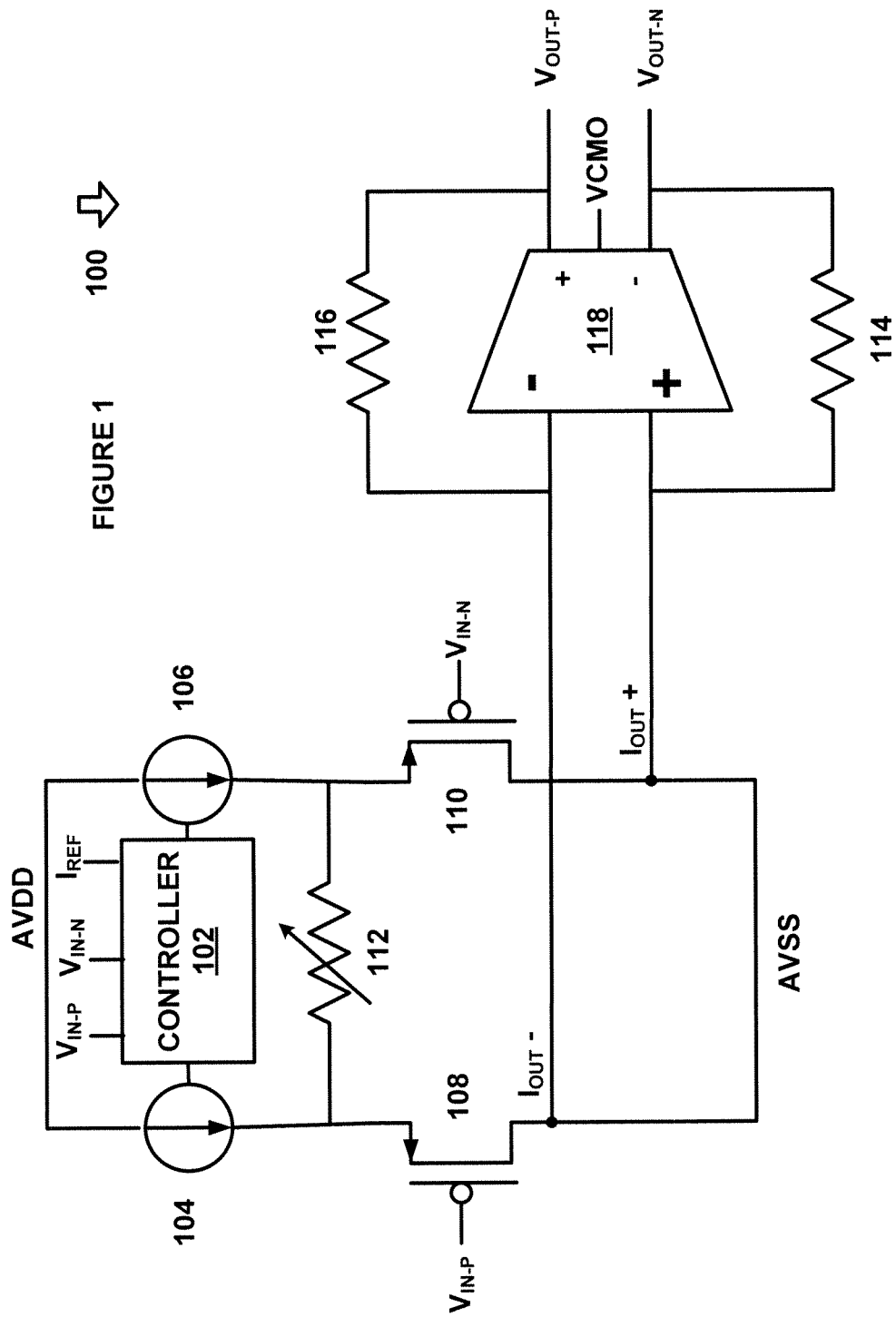
FIG. 1 is a diagram of a circuit for fast attack and slow decay peak detection for signal current control, in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

Low power dissipation is a key performance metric for integrated audio circuitry. The audio circuitry should use low power and be as simple as possible, while not impairing or compromising performance. In transconductor-based programmable gain amplifiers (PGAs), fixed current sources and references are typically established to supply current in order to allow required audio signal voltages to be developed without causing signal clipping, and to provide maximum signal fidelity. For operational amplifier-based audio amplifiers and buffers, class-AB biasing is commonly employed in the output stage in order to reduce the quiescent current.

The present disclosure utilizes an absolute value peak detector, coupled with a fast attack and long decay feature. It operates in a manner that is similar to how an audio compressor operates to provide signal gain. In one exemplary embodiment, the peak signals are detected, and then the corresponding peak currents are applied to the reference circuit path. Using a long decay time constant, the peak current is then allowed to gradually decay down to a minimum quiescent value. Peak detection coupled with a fast attack and long decay time can be optimal for an audio signal which has a high peak to rms characteristic, which can also be referred to as a high crest factor.

In the case of a transconductor-based PGA, the disclosed technique effectively makes the Class-A PGA operate in a manner similar to a Class-AB circuit, with lower quiescent current and lower noise. In the case of operational amplifier-based audio amplifiers and buffers (both class-A and class-AB) the disclosed technique can be used to modulate the biasing currents of the various amplifier stages, to result in lower quiescent power consumption without noticeable performance losses. The present disclosure also allows extremely low quiescent power dissipation without impacting total harmonic distortion (THD) performance.

One of the key component blocks in an audio receive signal path is the front end PGA. Low intrinsic circuit noise is also of importance in a PGA, because circuit noise impairs the dynamic range of the received signal and is amplified as the gain is increased.

One of the problems which the present disclosure is applicable to relates to such transconductance-based PGAs. Gain in a transconductor-based PGA is typically a function of the ratio of output to input resistor values. Since the resistor values are purposely designed to be of low ohmic value (to keep the resistor thermal noise low), developing signal voltages across these resistances requires significant current flow (to prevent signal clipping or distortion) and hence a fundamental power dissipation limit exists. In other words, there is a direct tradeoff between dynamic range and power dissipation unless some means is present to mitigate the power dissipation limit, as disclosed herein.

As discussed, fixed current sources and references can be used to supply sufficient current for required audio signal voltages to be developed without clipping, and to support maximum signal fidelity through low harmonic distortion. Previously, this required that the PGA operate in a class A fashion, where the maximum required signal current (plus some headroom) is always flowing, resulting in higher power consumption.

Utilizing the present disclosure, an absolute value peak detector can be employed and coupled with a fast attack and long decay feature, which operates similarly to how an audio compressor (for gain) works. The peak signals are detected and used to apply the proper peak currents to the reference circuit path and then, using a long decay time constant, the peak current is allowed to gradually decay down to a minimum quiescent value.

Simply applying a bias current based on peak detection signal (without the fast attack/long decay) would also achieve low power, but a disadvantage with this approach is that, in the presence of circuit mismatches, the common mode bias current control (which is created by the peak detection) is a non-linear signal that creates distortion in the differential circuit path and destroys the THD of a transconductor-based PGA.

The present disclosure couples peak detection with fast attack/long decay times for controlling the signal bias currents, which completely eliminates THD distortion degradation and at the same time allows very low quiescent bias currents, and low power dissipation. Furthermore, peak detection coupled with a fast attack and long decay times is ideal for an audio signal which has a high peak to rms characteristic, also known as a high crest factor.

Another issue that arises in transconductor-based PGA design is how to bias the common-mode of the virtual ground connection between the transconductor and the output transimpedance amplifier stage, in order to complete the PGA function. Optimally, the virtual ground inputs and the output stage common mode of the trans-impedance amplifier are biased at half the supply voltage ($V_{DD}/2$). This biasing results in a net zero volts across the feedback resistors and a low noise bias point for the stage. While this bias configuration provides for maximum voltage headroom at the output of the trans-impedance stage, it sets a headroom constraint on the output stage of the transconductor section that drives into the virtual ground. The virtual ground of the trans-impedance stage can be biased at a lower voltage to relax the headroom constraint on the transconductor output stage, but that bias degrades the noise performance of the trans-impedance input stage.

A virtual ground connection can be biased at a fixed low voltage, to provide the voltage headroom required by PGA transconductor output stage. However, this configuration results in higher power consumption and degraded noise performance.

By utilizing the signal peak detection and hold and decay function of the present disclosure to bias the virtual ground connection, it is possible to maximize the optimal noise and THD as a function of the signal level, while minimizing the power consumption.

The peak detection and fast attack slow release of the present disclosure can also be utilized to bias the virtual ground connection so that the headroom of the transconductor output stage is optimized, and at the same time the noise performance of the trans-impedance input stage can be minimized.

In summary, some of the advantages of the present disclosure over previous solutions include that it allows extremely low bias current and low power dissipation, and also allows extremely low THD, as well as numerous other advantages that are readily apparent to one of ordinary skill in the art.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as keyboards or mice, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

FIG. 1 is a diagram of a circuit 100 for fast attack and slow decay peak detection for signal current control, in accordance with an exemplary embodiment of the present disclosure. Circuit 100 can be implemented as discrete components, as an integrated circuit or in other suitable manners.

Circuit 100 includes controller 102, which receives a positive voltage input signal $V_{IN-P}$ and a negative voltage input signal $V_{IN-N}$ and which provides fast attack peak detect and slow decay for current source 104 and current source 106. Current source 104 is coupled to AVDD and the source of PMOS transistor 108. Current source 106 is coupled to AVDD and the source of PMOS transistor 110. PMOS transistor 108 and PMOS transistor 110 form a tranconductance input stage. A variable resistance 112, which provides a resistance value $R_G$, is provided across the sources of PMOS transistors 108 and 110, and provides the gain of circuit 100 of trans-impedance output stage 118 in conjunction with resistors 114 and 116, which each have a resistance value of $R_F$, in accordance with the equation:

$$gain=(vo/vi)=(R_F/R_G),$$

where
vo=VIP-VIN, and
vi=VOP-VON.

In operation, an input signal is received and is amplified by PMOS transistor 108 and PMOS transistor 110. Current sources 104 and 106 are used to provide a fast attack peak detection and slow decay in conjunction with controller 102.

Figure 2:
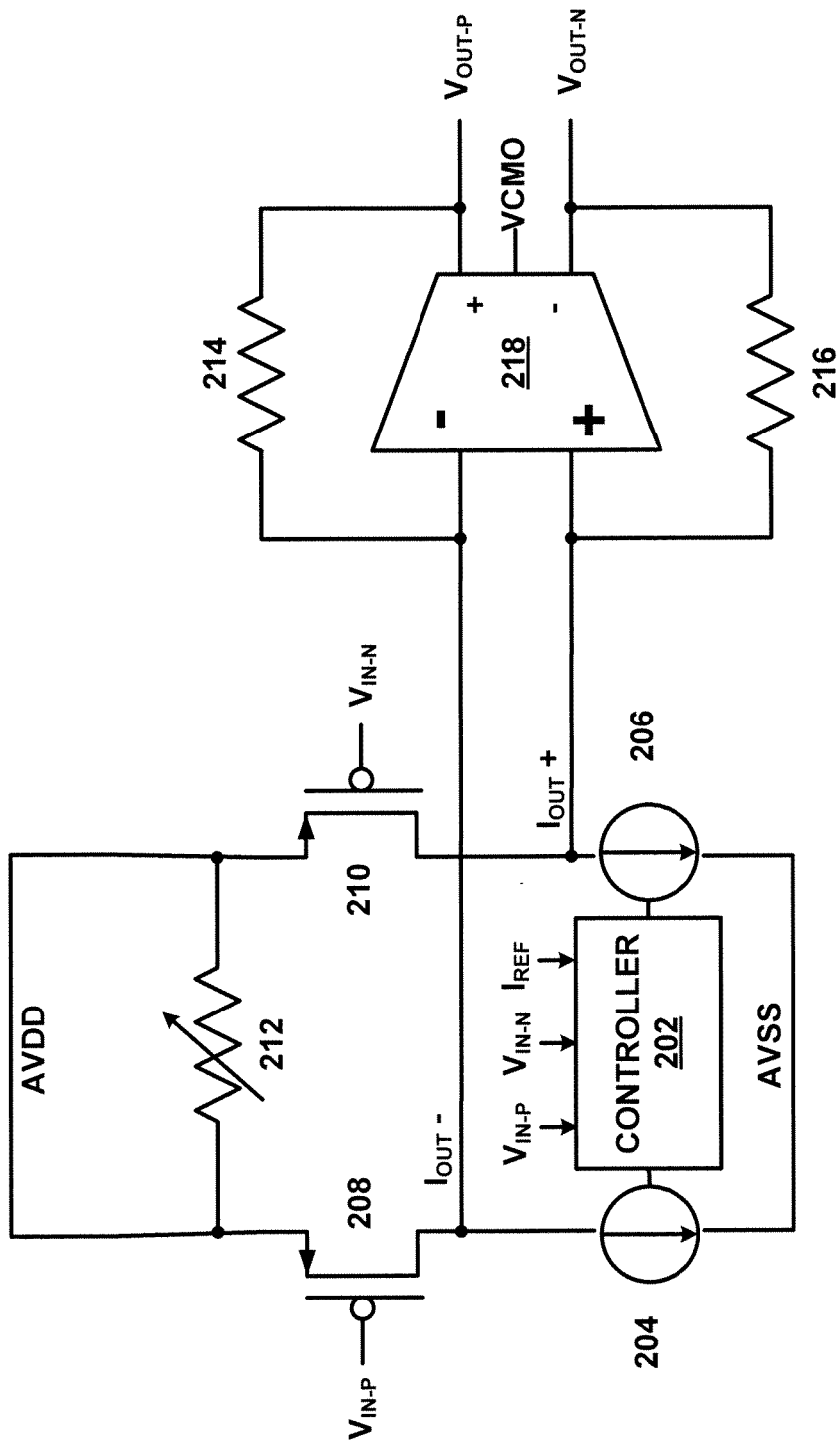
FIG. 2 is a diagram of a circuit for fast attack and slow decay peak detection for virtual ground voltage control, in accordance with an exemplary embodiment of the present disclosure.

FIG. 2 is a diagram of a circuit 200 for fast attack and slow decay peak detection for virtual ground voltage control, in accordance with an exemplary embodiment of the present disclosure. Circuit 200 can be implemented as discrete components, as an integrated circuit or in other suitable manners.

Circuit 200 includes controller 202, which receives positive input voltage $V_{IN-P}$ and negative input voltage $V_{IN-N}$ and which provides fast attack peak detect and slow decay control, and which is coupled to current source 204, which is coupled between the drain of PMOS transistors 208 and AVSS, and to current source 206, which is coupled between the drain of PMOS transistor 210 and AVSS, and which forms a trans-conductance input stage. A variable resistance 212 having a resistance $R_G$ is provided across the sources of PMOS transistors 208 and 210, and provides the gain of circuit 200 in conjunction with resistor 214 and resistor 216, which each have a resistance $R_F$, of the trans-impedance output stage, in accordance with the equation:

$$gain=(vo/vi)=(R_F/R_G),$$

where
   vo=VIP-VIN, and
   vi=VOP-VON.

In operation, an input signal is received and is amplified by PMOS transistor 208 and PMOS transistor 210. Current sources 204 and 206 are used to provide a fast attack peak detection and slow decay in conjunction with controller 202.

Figure 3:
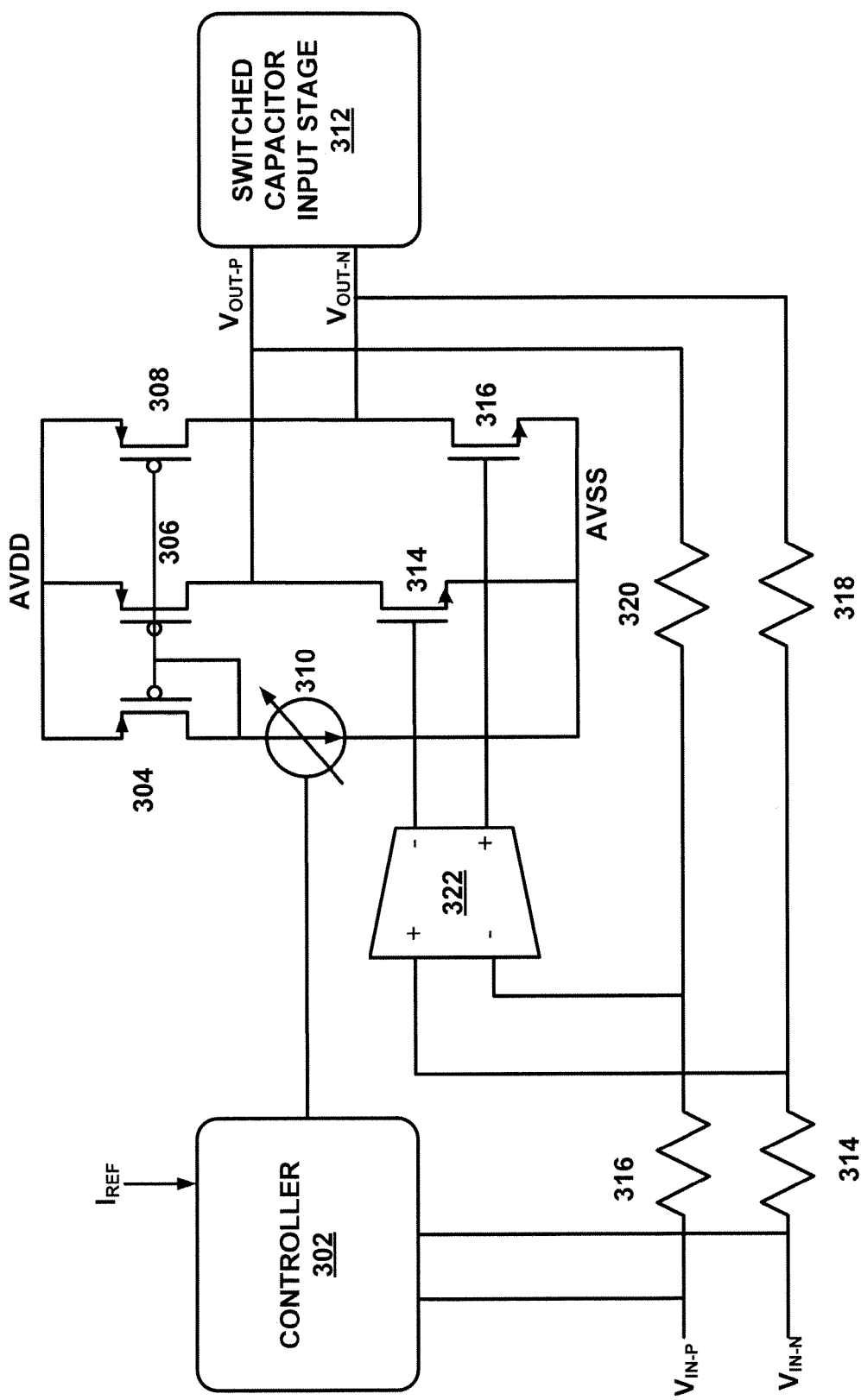
FIG. 3 is a diagram of a circuit for an A/D converter input buffer with adaptive bias control that utilizes fast attack and slow decay peak detection in accordance with an exemplary embodiment of the present disclosure.

FIG. 3 is a diagram of a circuit 300 for an A/D converter input buffer with adaptive bias control that utilizes fast attack and slow decay peak detection in accordance with an exemplary embodiment of the present disclosure. Circuit 300 can be implemented as discrete components, as an integrated circuit or in other suitable manners.

Circuit 300 includes A/D buffer amplifier output stage having PMOS transistors 304, PMOS transistor 306 and PMOS transistor 308, which are each coupled to AVDD. NMOS transistor 314 is coupled to PMOS transistor 306 and AVSS, and NMOS transistor 316 is coupled to PMOS transistor 308 and AVSS. Controller 302 receives current reference IREF and inputs VIN and VIP provides a peak detector having fast attack and slow decay, and is coupled to current source 310, which is in series with PMOS transistor 304. The output of circuit 300 is coupled to switched capacitor input stage 312.

Circuit 300 is an exemplary embodiment of a different application that has a similar tradeoff in dynamic range and power consumption, as in the previous exemplary embodiments. In circuit 300, a buffer stage drives a high dynamic range analog to digital (A/D) converter, which typically has low input impedance in order to keep the input referred noise low. For a switched capacitor A/D such as switched capacitor input stage 312, the buffer stage that drives the input must sink and source switched currents into the input capacitors very rapidly in order for the input signal voltages to settle to very high accuracy within a time period that is defined by the sampling period of the A/D converter. The current in a capacitor is proportional to both the capacitor value and the rate of change of voltage across the capacitor (Ic=C*dv/dt), such that the currents that must be supplied by the buffer stage are large, and consume high power.

In order to supply large currents, a buffer stage typically has to be biased in Class A fashion which has very poor power consumption. Traditional Class AB biasing can be employed, but using this technique complicates the settling time and frequency compensation of the buffer amplifier, which degrades the THD.

Therefore, for the A/D Converter buffer application, the peak detection and hold of the present disclosure can be utilized to break through traditional tradeoff barriers so as to provide low-noise, high-dynamic range and low THD with low power dissipation.

Figure 4:
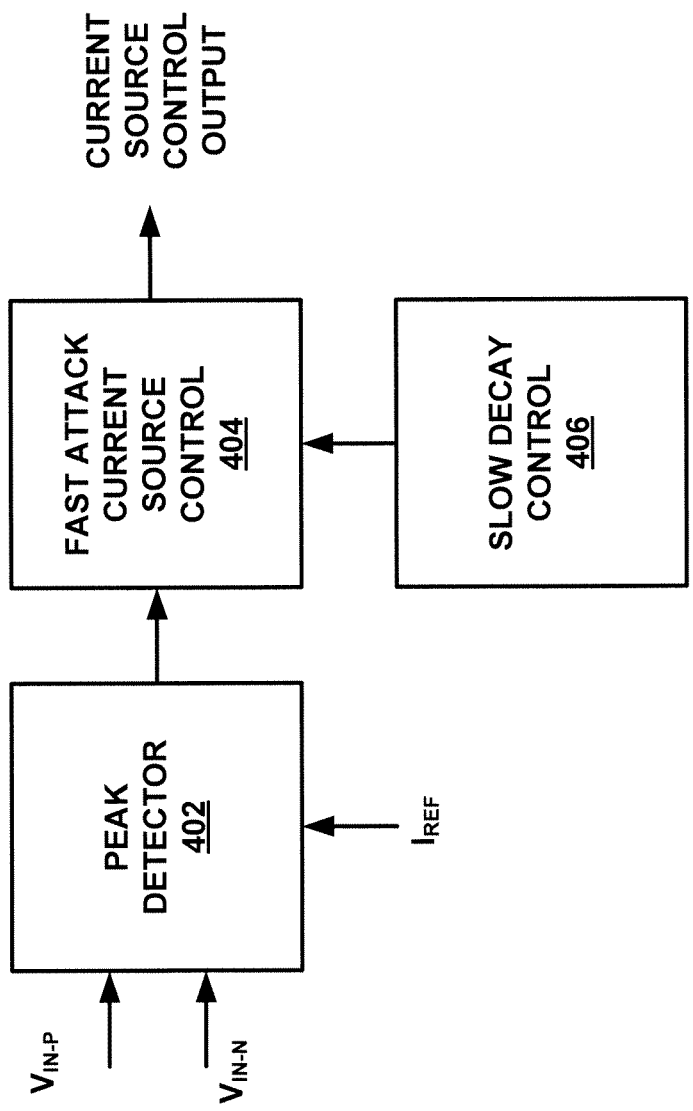
FIG. 4 is a diagram of a circuit for fast attack and slow decay current source control in accordance with an exemplary embodiment of the present disclosure.

FIG. 4 is a diagram of a circuit 400 for fast attack and slow decay current source control in accordance with an exemplary embodiment of the present disclosure. Circuit 400 includes peak detector 402, which can be circuitry for detecting a current signal peak, a voltage signal peak or other suitable peak detector circuitry. Peak detector 402 receives an input from negative voltage source input $V_{IN-N}$ and positive voltage source input $V_{IN-P}$ and reference current source $I_{REF}$, and is coupled to fast attack current source control 404, which can be a high speed amplifier or other suitable high speed signal sources. Slow decay control 406 is coupled to fast attack current source control 404 and causes the current source control signal output to slowly decay, based on a predetermined or user-selected decay rate.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A circuit comprising:
   a peak detector configured to receive a positive voltage input, a negative voltage input and a reference current source input and to output a peak signal data value;
   a fast attack current source control coupled to the peak detector and configured to generate a current source control signal as a function of the peak signal data value;
   a slow decay control coupled to the fast attack current source control and configured to reduce the current source control signal based on a predetermined or user-selected decay rate;
   a variable current source coupled to the fast attack current source control and configured to generate a variable current as a function of the current source control signal; and
   amplifier circuitry coupled to the variable current source, the amplifier circuitry configured to receive the variable current and to amplify the positive voltage input and the negative voltage input.

2. The circuit of claim 1, wherein the amplifier circuitry comprises a transconductance input stage or an A/D buffer amplifier output stage.

3. The circuit claim 1, further comprising a second variable current source coupled to the fast attack current source control and configured to generate a variable current as a function of the current source control signal.

4. The circuit of claim 3, wherein the amplifier circuitry further comprises a first PMOS transistor coupled to the variable current source, and a second PMOS transistor coupled to the second variable current source.

5. The circuit of claim 4, further comprising an output stage having a positive input coupled to the first PMOS transistor and a negative input coupled to the second PMOS transistor.

6. The circuit of claim 5, further comprising a first resistor coupled between the positive input of the output stage and a negative output of the output stage, and a second resistor coupled between the negative input of the output stage and a positive output of the output stage.

7. The circuit of claim 6, further comprising a variable resistor coupled between the variable current source and the second variable current source, wherein a gain of the circuit is proportional to a ratio of a resistance value of the first resistor and the second resistor to a resistance value of the variable resistor.

8. The circuit of claim 1, further comprising a switched capacitor input stage coupled to the amplifier circuitry.

9. A circuit comprising:
   a peak detector configured to receive a positive voltage input, a negative voltage input and a reference current source input and to output a peak signal data value;

a fast attack current source control coupled to the peak detector and configured to generate a current source control signal as a function of the peak signal data value;

a slow decay control coupled to the fast attack current source control and configured to reduce the current source control signal based on a predetermined or user-selected decay rate;

a first variable current source coupled to the fast attack current source control and configured to generate a first variable current as a function of the current source control signal;

a second variable current source coupled to the fast attack current source control and configured to generate a second variable current as a function of the current source control signal;

a variable resistor having a first end coupled to the first variable current source and a second end coupled to the second variable current source;

a first PMOS transistor coupled to the first variable current source and the first end of the variable resistor;

a second PMOS transistor coupled to the second variable current source and the second end of the variable resistor; an output stage having a positive input coupled to the first PMOS transistor and a negative input coupled to the second PMOS transistor;

a first resistor coupled between the positive input of the output stage and a negative output of the output stage, and a second resistor coupled between the negative input of the output stage and a positive output of the output stage; and wherein a gain of the circuit is proportional to a ratio of a resistance value of the first resistor and the second resistor to a resistance value of the variable resistor.

10. A circuit comprising:

a controller configured to receive a positive input signal and a negative input signal and to generate a fast attack control signal with slow decay as a function of a peak of the positive input signal and the negative input signal;

a variable current source coupled to the controller and configured to generate a variable current as a function of the fast attack control signal with slow decay; and amplifier circuitry coupled to the variable current source, the amplifier circuitry configured to receive the variable current and to amplify the positive input signal and the negative input signal.

11. The circuit of claim 10, wherein the controller comprises a peak detector configured to receive the positive input signal, the negative input signal and a reference current source input and to output a peak signal data value.

12. The circuit of claim 11, further comprising a fast attack current source control coupled to the peak detector and configured to generate a current source control signal as a function of the peak signal data value.

13. The circuit of claim 12, further comprising a slow decay control coupled to the fast attack current source control and configured to reduce the fast attack control signal based on a predetermined or user-selected decay rate.

14. The circuit claim 13, further comprising a second variable current source coupled to the controller and configured to generate a variable current as a function of the fast attack control signal with slow decay.

15. The circuit of claim 14, wherein the amplifier circuitry further comprises a first PMOS transistor coupled to the variable current source, and a second PMOS transistor coupled to the second variable current source.

16. The circuit of claim 15, further comprising an output stage having a positive input coupled to the first PMOS transistor and a negative input coupled to the second PMOS transistor.

17. The circuit of claim 16, further comprising a first resistor coupled between the positive input of the output stage and a negative output of the output stage, and a second resistor coupled between the negative input of the output stage and a positive output of the output stage.

18. The circuit of claim 17, further comprising a variable resistor coupled between the variable current source and the second variable current source, wherein a gain of the circuit is proportional to a ratio of a resistance value of the first resistor and the second resistor to a resistance value of the variable resistor.

19. The circuit of claim 11, further comprising a switched capacitor input stage coupled to the amplifier circuitry.

* * * * *